(12) United States Patent
Redd et al.

(10) Patent No.: US 6,939,781 B2
(45) Date of Patent: Sep. 6, 2005

(54) METHOD OF MANUFACTURING A SEMICONDUCTOR COMPONENT THAT INCLUDES SELF-ALIGNING A GATE ELECTRODE TO A FIELD PLATE

(75) Inventors: Randy D. Redd, Chandler, AZ (US); Paul A. Fisher, Tempe, AZ (US); Olin L. Hartin, Phoenix, AZ (US); Lawrence S. Klingbeil, Chandler, AZ (US); Ellen Lan, Chandler, AZ (US); Hsin-Hua P. Li, Scottsdale, AZ (US); Charles E. Weitzel, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/609,106

(22) Filed: Jun. 27, 2003

(65) Prior Publication Data

US 2004/0262629 A1 Dec. 30, 2004

(51) Int. Cl.[7] .................................................. H01L 21/76
(52) U.S. Cl. ....................................... 438/454; 438/589
(58) Field of Search ................................. 438/182, 270, 438/294, 299, 454, 586, 589

(56) References Cited

U.S. PATENT DOCUMENTS

| | | | | |
|---|---|---|---|---|
| 5,340,768 A | * | 8/1994 | Gill .............................. | 438/454 |
| 5,605,845 A | * | 2/1997 | Young .......................... | 438/157 |
| 5,767,550 A | * | 6/1998 | Calafut et al. ............... | 257/355 |
| 5,831,320 A | | 11/1998 | Kwon et al. | |
| 5,913,118 A | * | 6/1999 | Wu .............................. | 438/243 |
| 5,925,919 A | * | 7/1999 | Kerber ........................ | 257/421 |
| 6,033,948 A | | 3/2000 | Kwon et al. | |
| 6,107,160 A | * | 8/2000 | Hebert et al. ................ | 438/454 |
| 6,465,845 B1 | * | 10/2002 | Baek ........................... | 257/343 |
| 2004/0021182 A1 | * | 2/2004 | Green et al. ................. | 257/409 |

OTHER PUBLICATIONS

Stanley Wolf and Richard N. Tauber, "Silicon Processing for the VLSI Era—vol. 1: Processing Technology," Lattice Press, Sunset Beach, California, 1986, p. 124.*

Sakura, et al.; *100W L–Band GaAs Power FP–HFET Operated at 30V; 2000 IEEE MTT–S Digest*, pp. 1715–1718.

* cited by examiner

*Primary Examiner*—Stephen W. Smoot
(74) *Attorney, Agent, or Firm*—Bryan Cave LLP

(57) ABSTRACT

In one embodiment of the invention, a semiconductor component includes a semiconductor substrate (110), a first dielectric layer (120) above the semiconductor substrate, a first ohmic contact region (410) and a second ohmic contact region (420) above the semiconductor substrate, a gate electrode (1120) above the semiconductor substrate and between the first ohmic contact region and the second ohmic contact region, a field plate (210) above the first dielectric layer and between the gate electrode and the second ohmic contact region, a second dielectric layer (310) above the field plate, the first dielectric layer, the first ohmic contact region, and the second ohmic contact region, and a third dielectric layer (910) between the gate electrode and the field plate and not located above the gate electrode or the field plate.

17 Claims, 5 Drawing Sheets

US 6,939,781 B2

METHOD OF MANUFACTURING A SEMICONDUCTOR COMPONENT THAT INCLUDES SELF-ALIGNING A GATE ELECTRODE TO A FIELD PLATE

FIELD OF THE INVENTION

This invention relates generally to semiconductor components, and relates more particularly to semiconductor components comprising a field plate.

BACKGROUND OF THE INVENTION

Transistors are often negatively affected by electric fields occurring therein, such as an electric field occurring between the gate and drain electrodes of a field effect transistor. One approach that has been used in order to reduce the negative effects of such an electric field is to include a field plate in the transistor. A field plate acts to disperse or otherwise reduce the electric field, thus improving the breakdown voltage of the transistor. However, in order to optimize the improved breakdown voltage, certain applications require that the field plate be placed within a distance from the gate electrode that is difficult or impossible to achieve given the limitations of the manufacturing process. Accordingly, there is a need for a semiconductor component, and for a method of manufacturing a semiconductor component, where the semiconductor component includes a field plate properly located so as to optimize the reduction in electric field and the increase in breakdown voltage.

BRIEF DESCRIPTION OF THE DRAWINGS

The invention will be better understood from a reading of the following detailed description, taken in conjunction with the accompanying figures in the drawings in which.

Figure 1:
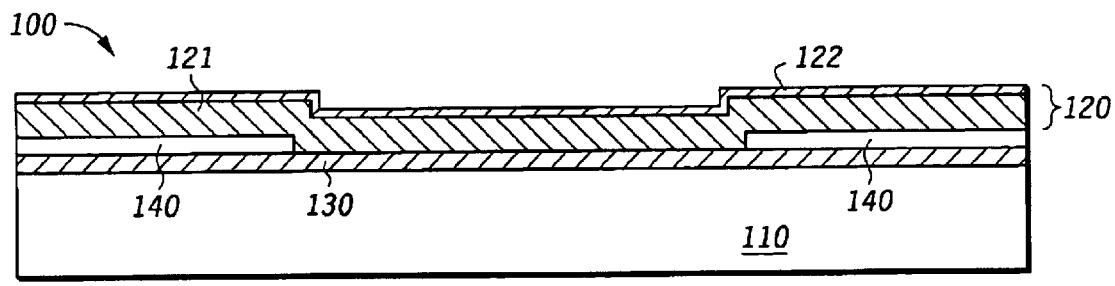
FIG. 1 is a cross-sectional view of a portion of a semiconductor component at a particular point in a manufacturing process according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In order to overcome the limitations of a manufacturing process and to achieve the desired registration requirements between a field plate and a gate electrode in a semiconductor device, a self-alignment method is proposed. The self-alignment is accomplished using a dielectric spacer that also physically and, in some embodiments, electrically isolates the gate electrode from the field plate, thus improving the breakdown voltages of the semiconductor device. In other embodiments, the field plate and the gate electrode may be electrically coupled together, and, in such embodiments, the dielectric spacer physically isolates but does not electrically isolate the gate electrode and the field plate. The self-alignment method may further make the gate-to-drain breakdown voltage less temperature sensitive, and/or may improve the signal gain of the semiconductor device.

Referring now to the figures, FIG. 1 is a cross-sectional view of a portion of a semiconductor component 100 at a particular point in a manufacturing process according to an embodiment of the invention. Semiconductor component 100 comprises a semiconductor substrate 110 and a dielectric layer 120 above semiconductor substrate 110. As an example, dielectric layer 120 can comprise a silicon-nitride layer 121 and an aluminum-nitride layer 122. In one embodiment, dielectric layer 120 has a thickness of between approximately 50 and 200 nanometers.

In one embodiment, semiconductor component 100 can further comprise a semiconductor layer 130 between semiconductor substrate 110 and dielectric layer 120. As an example, semiconductor substrate 110 and semiconductor layer 130 can comprise a composite substrate, where semiconductor substrate 110 is a support substrate and semiconductor layer 130 is a semiconductor epitaxial layer. As a further example, semiconductor layer 130 can comprise gallium arsenide (GaAs). As other examples, semiconductor layer 130 can comprise indium phosphide, gallium nitride, or the like.

In the same or another embodiment, semiconductor component 100 can further comprise a heavily-doped semiconductor layer 140 above semiconductor layer 130. As an example, heavily-doped semiconductor layer 140 can comprise GaAs doped with silicon or the like.

Figure 2:
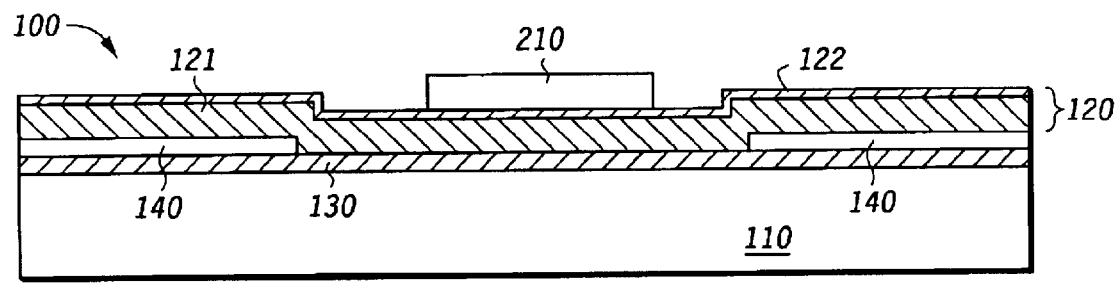
FIG. 2 is a cross-sectional view of the semiconductor component of FIG. 1 at a later point in the manufacturing process according to an embodiment of the invention.

FIG. 2 is a cross-sectional view of semiconductor component 100 at a later point in the manufacturing process according to an embodiment of the invention. As illustrated in FIG. 2, semiconductor component 100 further comprises a field plate 210 above dielectric layer 120. In one embodiment, field plate 210 comprises titanium tungsten nitride. As will be further explained below, a portion of field plate 210 may be removed at a subsequent point in the manufacturing process. Accordingly, field plate 210 may be initially formed to have a length longer than its intended final length, meaning a layer of field plate material may be deposited over first dielectric layer 120 and then the layer of field plate material may be etched to form field plate 210. As an example, field plate 210 may be formed to extend into a region of semiconductor component 100 where a hole to receive a gate electrode will subsequently be formed. As a particular example, field plate 210 may be initially formed to have a length of greater than 500 nanometers. During or after the formation of the gate electrode hole, the portion of field plate 210 that extends into the hole may be removed, thus giving field plate 210 its final length. This process allows field plate 210 to be terminated precisely on the drain edge of the gate electrode hole. At least some of the processing steps pursuant to the formation of semiconductor component 100 will be further explained below.

Figure 3:
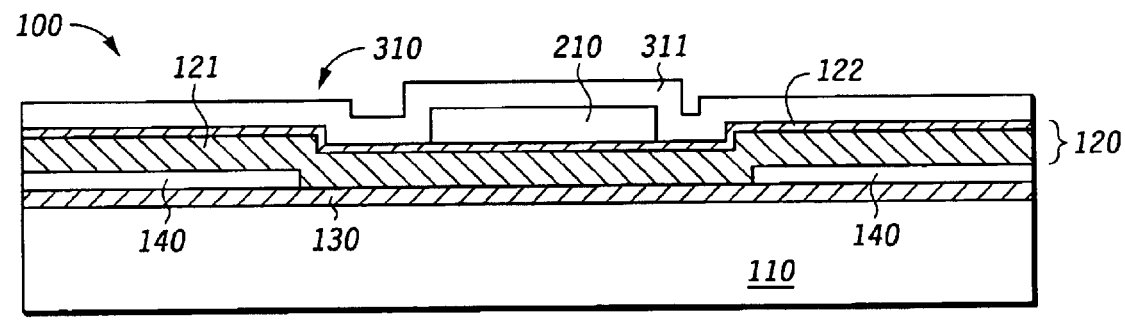
FIG. 3 is a cross-sectional view of the semiconductor component of FIG. 2 at a later point in the manufacturing process according to an embodiment of the invention.

FIG. 3 is a cross-sectional view of semiconductor component 100 at a later point in the manufacturing process according to an embodiment of the invention. As illustrated in FIG. 3, semiconductor component 100 further comprises a dielectric layer 310 above field plate 210 and dielectric layer 120. As an example, dielectric layer 310 can comprise a tetra-ethyl-ortho-silicate layer 311.

Figure 4:
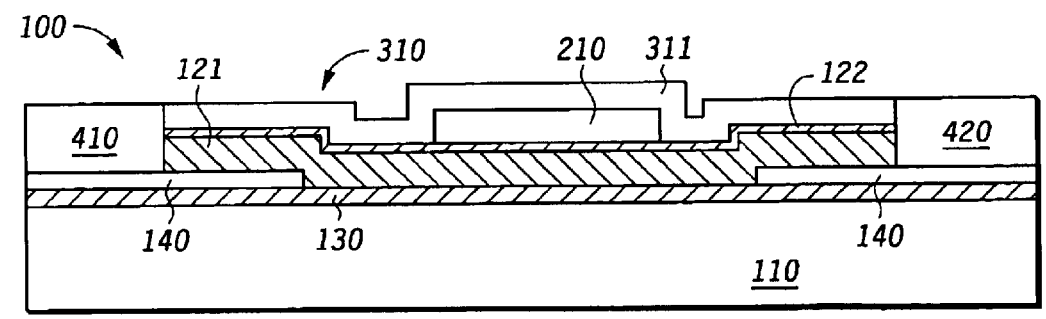
FIG. 4 is a cross-sectional view of the semiconductor component of FIG. 3 at a later point in the manufacturing process according to an embodiment of the invention.

FIG. 4 is a cross-sectional view of semiconductor component 100 at a later point in the manufacturing process according to an embodiment of the invention. As illustrated in FIG. 4, semiconductor component 100 further comprises an ohmic contact region 410 and an ohmic contact region 420 above semiconductor substrate 110. As an example, ohmic contact region 410 can be a source ohmic contact, and ohmic contact region 420 can be a drain ohmic contact.

Figure 5:
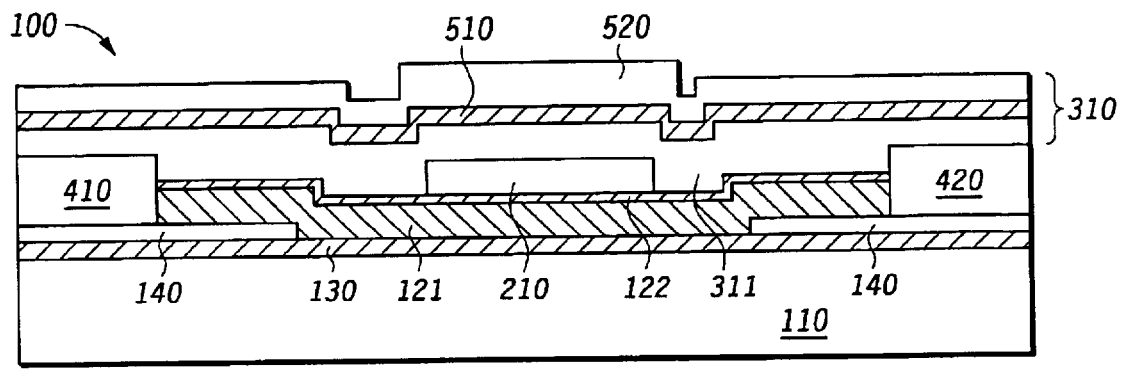
FIG. 5 is a cross-sectional view of the semiconductor component of FIG. 4 at a later point in the manufacturing process according to an embodiment of the invention.

FIG. 5 is a cross-sectional view of semiconductor component 100 at a later point in the manufacturing process according to an embodiment of the invention. As illustrated in FIG. 5, dielectric layer 310 further comprises an aluminum-nitride layer 510 and a tetra-ethyl-ortho-silicate layer 520. In the illustrated embodiment, aluminum-nitride layer 510 is between tetra-ethyl-ortho-silicate layer 311 and tetra-ethyl-ortho-silicate layer 520.

Figure 6:
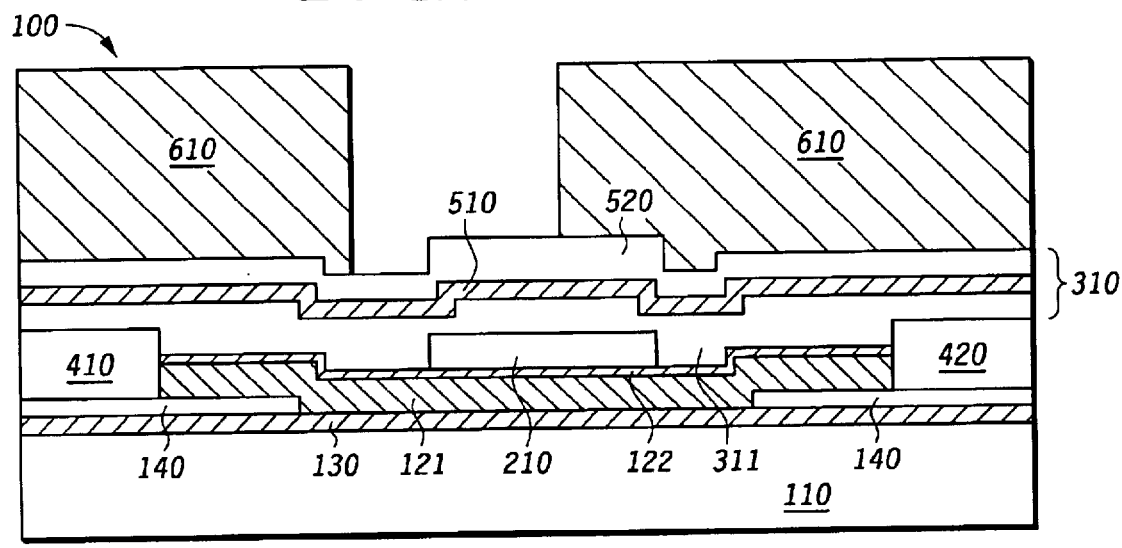
FIG. 6 is a cross-sectional view of the semiconductor component of FIG. 5 at a later point in the manufacturing process according to an embodiment of the invention.

FIG. 6 is a cross-sectional view of semiconductor component 100 at a later point in the manufacturing process according to an embodiment of the invention. As illustrated in FIG. 6, semiconductor component 100 further comprises a photoresist layer 610 above dielectric layer 310. Photoresist layer 610 is patterned so as to expose a portion of dielectric layer 310 above field plate 210, as will be further explained below.

Figure 7:
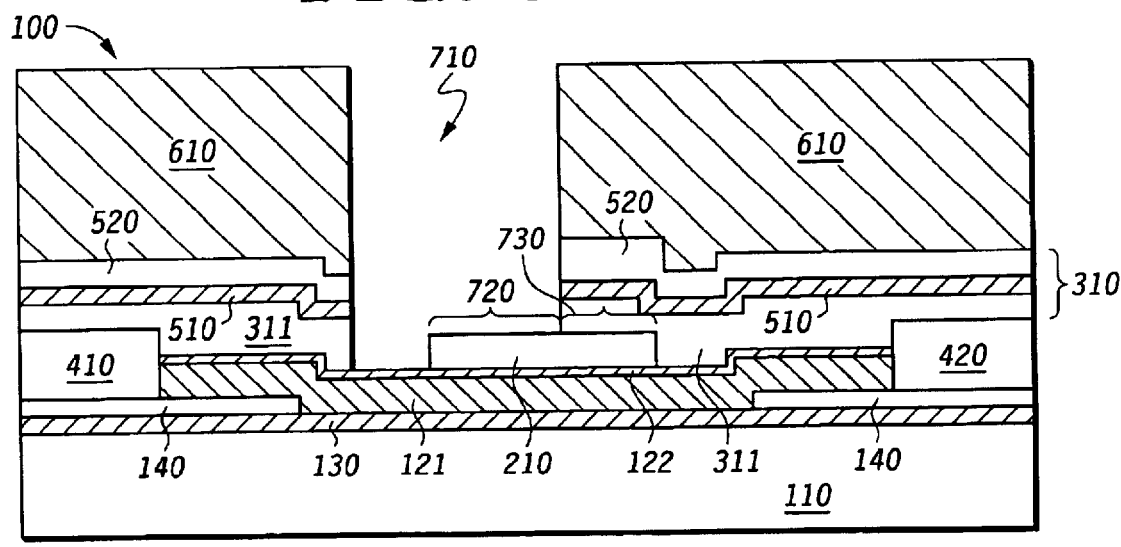
FIG. 7 is a cross-sectional view of the semiconductor component of FIG. 6 at a later point in the manufacturing process according to an embodiment of the invention.

FIG. 7 is a cross-sectional view of semiconductor component 100 at a later point in the manufacturing process according to an embodiment of the invention. As illustrated in FIG. 7, a hole 710 has been formed in dielectric layer 310. Hole 710 exposes a portion 720 of field plate 210. A portion 730 of field plate 210 is not exposed by hole 710. In one embodiment, portion 730 of field plate 210 has a length of between approximately 300 and 2000 nanometers.

Figure 8:
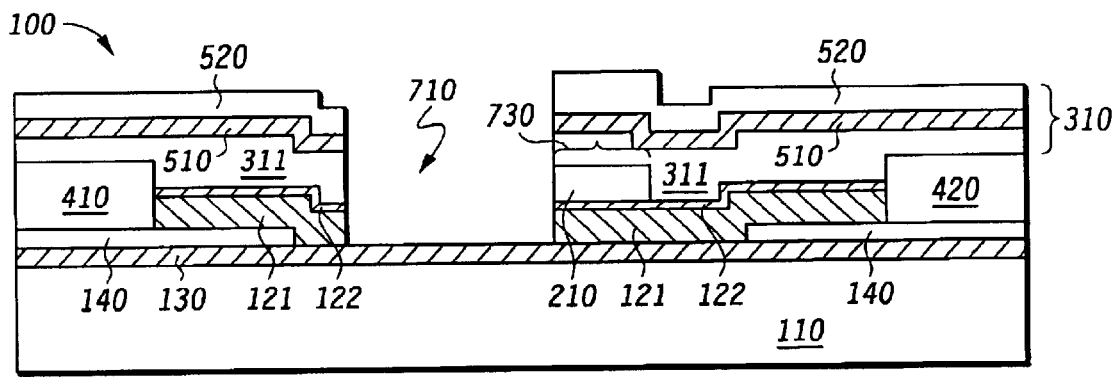
FIG. 8 is a cross-sectional view of the semiconductor component of FIG. 7 at a later point in the manufacturing process according to an embodiment of the invention.

FIG. 8 is a cross-sectional view of semiconductor component 100 at a later point in the manufacturing process according to an embodiment of the invention. As illustrated in FIG. 8, hole 710 has been extended through aluminum-nitride layer 122 and silicon-nitride layer 121. As further illustrated in FIG. 8, only portion 730 of field plate 210 remains, portion 720 (FIG. 7) of field plate 210 having been removed, as will be further explained below. It should be understood that in at least one embodiment, portion 720 of field plate 210 is removed before hole 710 is expanded through aluminum-nitride layer 122 and silicon-nitride layer 121.

Figure 9:
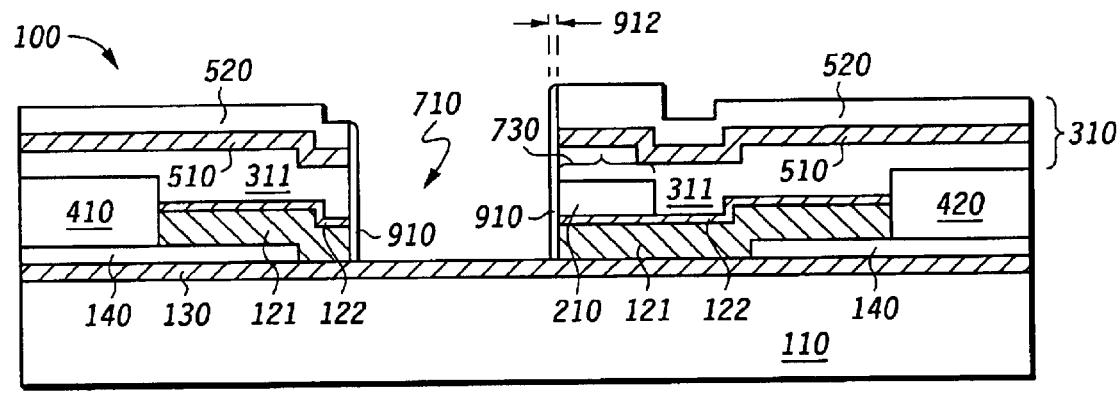
FIG. 9 is a cross-sectional view of the semiconductor component of FIG. 8 at a later point in the manufacturing process according to an embodiment of the invention.

FIG. 9 is a cross-sectional view of semiconductor component 100 at a later point in the manufacturing process according to an embodiment of the invention. As illustrated in FIG. 9, semiconductor component 100 further comprises a dielectric layer 910 in hole 710 and adjacent to portion 730 of field plate 210 but not located above portion 730 of field plate 210. A distance 912 separates field plate 210 and hole 710, and is substantially equivalent to a thickness of dielectric layer 910. In one embodiment, distance 912 is between approximately 20 and 400 nanometers. In one embodiment, dielectric layer 910 comprises silicon-nitride.

Figure 10:
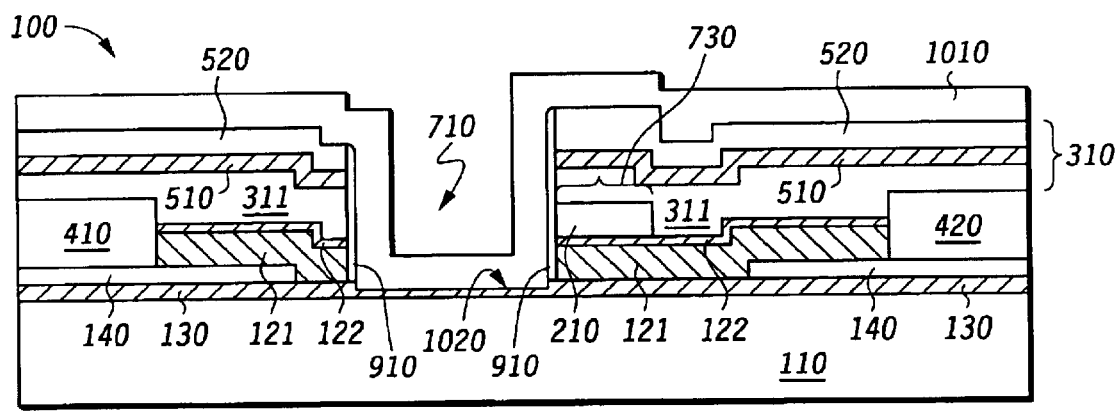
FIG. 10 is a cross-sectional view of the semiconductor component of FIG. 9 at a later point in the manufacturing process according to an embodiment of the invention.

FIG. 10 is a cross-sectional view of semiconductor component 100 at a later point in the manufacturing process according to an embodiment of the invention. As illustrated in FIG. 10, semiconductor component 100 further comprises a gate metal layer 1010 above dielectric layer 310 and in hole 710. Semiconductor component 100 still further comprises a gate recess 1020 adjacent to hole 710. Gate recess 1020 extends into semiconductor layer 130. In a non-illustrated embodiment, semiconductor component 100 does not comprise a gate recess.

Figure 11:
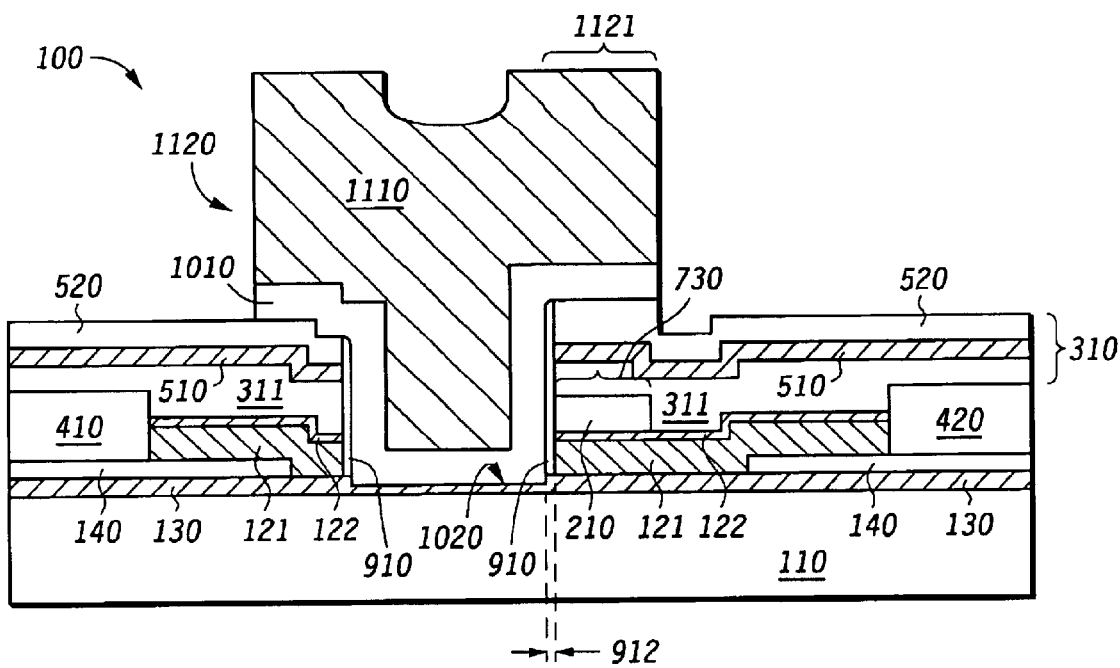
FIG. 11 is a cross-sectional view of the semiconductor component of FIG. 10 at a later point in the manufacturing process according to an embodiment of the invention.

FIG. 11 is a cross-sectional view of semiconductor component 100 at a later point in the manufacturing process according to an embodiment of the invention. As illustrated in FIG. 11, semiconductor component 100 further comprises a gate metal layer 1110 above gate metal layer 1010. Together, gate metal layer 1110 and gate metal layer 1010 comprise a gate electrode 1120. As FIG. 11 illustrates, gate electrode 1120 is located above semiconductor substrate 110 and between ohmic contact region 410 and ohmic contact region 420. Gate electrode 1120 is physically and, in some embodiments, electrically isolated from field plate 210 by dielectric layer 910. In one embodiment, gate metal layer 1010 of gate electrode 1120 comprises a titanium tungsten nitride layer. In the same or another embodiment, gate metal layer 1110 of gate electrode 1120 comprises a gold layer.

In the same or another embodiment, gate electrode 1120 comprises a T-gate electrode. In that embodiment, as illustrated in FIG. 11, a portion 1121 of gate electrode 1120 can overlie at least a portion of field plate 210. As an example, portion 1121 of gate electrode 1120 can overlie portion 730 of field plate 210. Gate electrode 1120 and field plate 210 are separated by distance 912. As stated above, in one embodiment distance 912 can be between approximately 20 and 400 nanometers.

Figure 12:
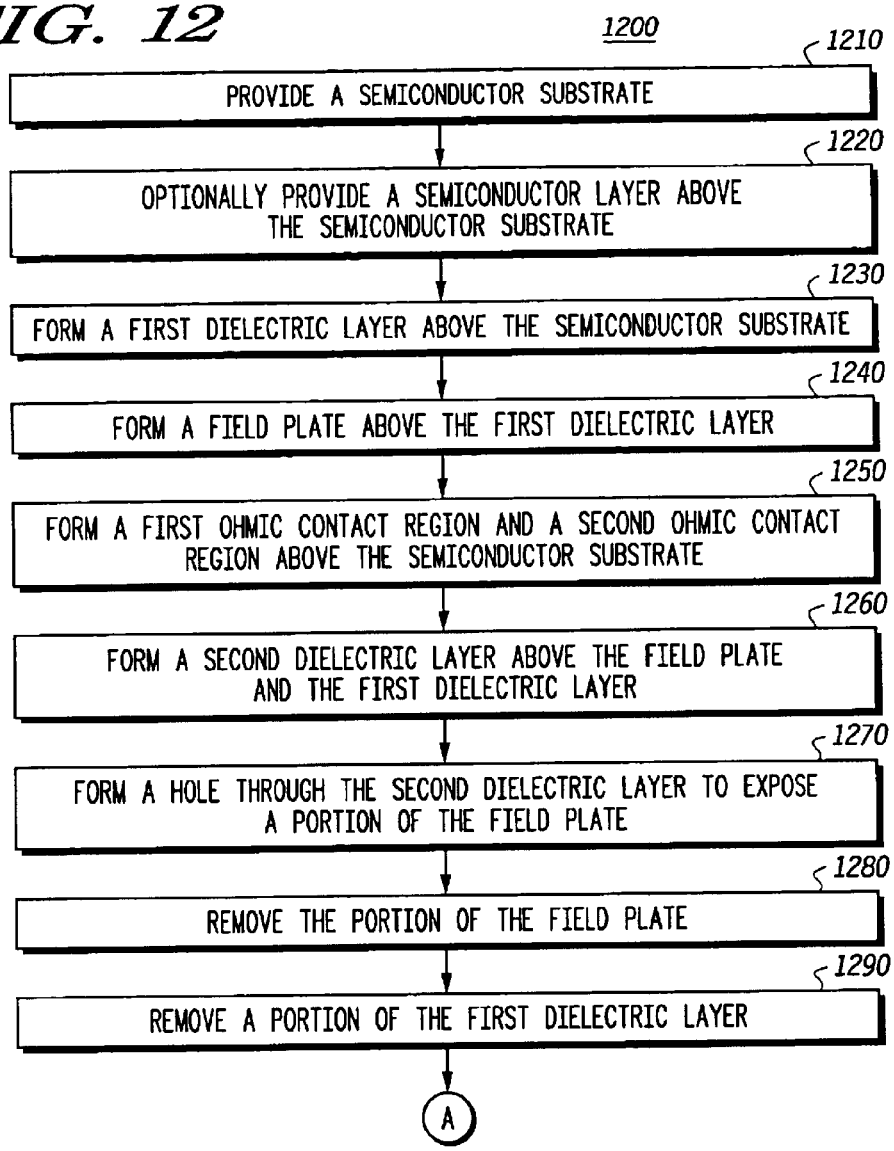
FIG. 12 is a flow chart illustrating a method of manufacturing a semiconductor component according to an embodiment of the invention.

FIG. 12 is a flow chart illustrating a method 1200 of manufacturing a semiconductor component according to an embodiment of the invention. A step 1210 of method 1200 is to provide a semiconductor substrate. As an example, the semiconductor substrate can be similar to semiconductor substrate 110, first shown in FIG. 1.

A step 1220 of method 1200 is to optionally provide a semiconductor layer above the semiconductor substrate. As an example, the semiconductor layer can be similar to semiconductor layer 130, first shown in FIG. 1.

A step 1230 of method 1200 is to form a first dielectric layer above the semiconductor substrate. As an example, the first dielectric layer can be similar to dielectric layer 120, first shown in FIG. 1. In one embodiment, step 1230 comprises forming the dielectric layer above the semiconductor layer. In an embodiment where the first dielectric layer is similar to dielectric layer 120, step 1230 can comprise a first sub-step wherein a silicon-nitride layer or another layer is deposited over the semiconductor substrate or the semiconductor layer, and a second sub-step wherein an aluminum nitride layer or another layer is deposited over the silicon-nitride or other layer.

A step 1240 of method 1200 is to form a field plate above the first dielectric layer. As an example, the field plate can be similar to field plate 210, first shown in FIG. 2.

A step 1250 of method 1200 is to form a first ohmic contact region and a second ohmic contact region above the semiconductor substrate. As an example, the first and second ohmic contact regions can be similar to ohmic contact regions 410 and/or 420, first shown in FIG. 4. Step 1250 can comprise a standard ohmic metal deposition and liftoff process, in which the second and first dielectric layers are etched to expose portions of a heavily-doped semiconductor layer prior to the formation of the first and second ohmic contact regions. As an example, the heavily-doped semiconductor layer can be similar to heavily-doped semiconductor layer 140, first shown in FIG. 1. As will be apparent to one of ordinary skill in the art, steps 1230, 1240, and 1250 can be performed in any order, provided that step 1240 occurs after step 1230.

A step 1260 of method 1200 is to form a second dielectric layer above the field plate and the first dielectric layer. As an example, the second dielectric layer can be similar to dielectric layer 310, first shown in FIG. 3.

A step 1270 of method 1200 is to form a hole through the second dielectric layer to expose a portion of the field plate. As an example, the hole can be similar to hole 710, first shown in FIG. 7. As another example, the portion of the field plate can be similar to portion 720, first shown in FIG. 7. In one embodiment, step 1270 comprises: etching a portion of the second dielectric layer; etching an exposed portion of the field plate; and etching a portion of the first dielectric layer. As will be understood by one of ordinary skill in the art, the second dielectric layer, the field plate, and the first dielectric layer may each require different etch chemistries in order to be removed. Accordingly, etching a portion of the second dielectric layer can comprise a first sub-step of step 1270, etching a portion of the field plate can comprise a second sub-step of step 1270, and etching a portion of the first dielectric layer can comprise a third sub-step of step 1270. In still another embodiment, etching a portion of the second dielectric layer, etching an exposed portion of the field plate, and etching a portion of the first dielectric layer can each comprise separate steps of method 1200. As an illustration of this embodiment, etching an exposed portion of the field plate is also discussed below, in slightly different terms, as step 1280.

As an example, etching a portion of the second dielectric layer and/or etching a portion of the field plate can comprise using an aluminum-nitride layer as an etch stop layer. As another example, the aluminum-nitride layer can be similar to aluminum-nitride layer 122, first shown in FIG. 1. As still another example, etching a portion of the field plate can further comprise shortening a length of the field plate to between approximately 300 and 2000 nanometers.

A step 1280 of method 1200 is to remove the portion of the field plate. As mentioned above, in one embodiment step 1280 can be a sub-step of, or can occur simultaneously with, step 1270 instead of occurring in a separate step.

A step 1290 of method 1200 is to remove a portion of the first dielectric layer. As an example, the portion of the first dielectric layer that is removed in step 1290 can be the portion of the first dielectric layer that is exposed by the hole formed in step 1270. Step 1290 is followed by a box A, representing a transition step from method 1200 in FIG. 12 to its continuation described in FIG. 13.

Figure 13:
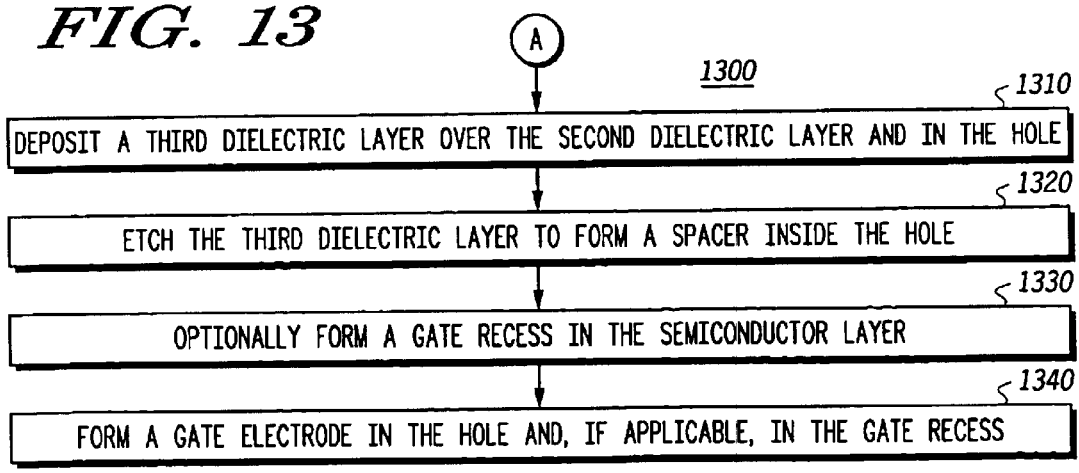
FIG. 13 is a flow chart illustrating a continuation of the method of manufacturing a semiconductor component described in FIG. 12, according to an embodiment of the invention.

FIG. 13 is a flow chart illustrating a method 1300 of manufacturing a semiconductor component according to an embodiment of the invention. Method 1300 is a continuation of method 1200, described in FIG. 12, and begins at box A in FIG. 13. Box A in FIG. 13 represents the same transition step as that represented by box A in FIG. 12. Referring to FIG. 13, a step 1310 of method 1300 is to deposit a third dielectric layer over the second dielectric layer and in the hole. As an example, the third dielectric layer can be similar to dielectric layer 910, first shown in FIG. 9. In one embodiment, step 1310 or another step can comprise a cleaning procedure.

A step 1320 of method 1300 is to etch the third dielectric layer to form a spacer inside the hole. In one embodiment, step 1320 may control the spacing between the gate electrode (formed in a step 1340, below) and the field plate. The thickness of the third dielectric layer is determined by step 1320. The etch performed in step 1320 can precisely control the thickness of the third dielectric layer to within the required limits. As an example, the thickness of the third dielectric layer can be made to be substantially equivalent to distance 912, first shown in FIG. 9.

A step 1330 of method 1300 is to optionally form a gate recess in the semiconductor layer. As an example, the gate recess can be similar to gate recess 1020, first shown in FIG. 10.

Step 1340 of method 1300 is to form a gate electrode in the hole and, if applicable, in the gate recess. As an example, the gate electrode can be similar to gate electrode 1120, first shown in FIG. 11.

In one embodiment, steps 1260, 1270, 1280, 1290, 1310, 1320, 1330, and 1340 comprise self aligning the gate electrode to the field plate. Self aligning the gate electrode to the field plate can reduce parasitic capacitance between the field plate and the gate electrode, reduce the electric field in the vicinity of the gate electrode, increase the breakdown voltage between the first and second ohmic contact regions and/or the gate electrode and the second ohmic contact region, make the gate-to-drain breakdown voltage less temperature sensitive, and improve the signal gain of the semiconductor component.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a semiconductor component, the method comprising:
   providing a semiconductor substrate;
   forming a first dielectric layer above the semiconductor substrate;
   forming a field plate above the first dielectric layer;
   self-aligning a gate electrode to the field plate; and
   forming a first ohmic contact region and a second ohmic contact region above the semiconductor substrate,
   wherein:
      self-aligning the gate electrode to the field plate further comprises:
         forming the gate electrode after forming the first ohmic contact region and the second ohmic contact region; and
         forming the gate electrode to be between the first ohmic contact region and the second ohmic contact region.

2. The method of claim 1 further comprising:
   forming a semiconductor layer above the semiconductor substrate before forming the first dielectric layer,
   wherein:
      forming the first dielectric layer comprises:
         forming the first dielectric layer above the semiconductor layer.

3. The method of claim 1 wherein:
   self aligning the gate electrode to the field plate further comprises:
      forming a second dielectric layer above the field plate and the first dielectric layer;
      forming a hole through the second dielectric layer to expose a portion of the field plate;
      removing the portion of the field plate;
      removing a portion of the first dielectric layer;
      depositing a third dielectric layer over the second dielectric layer and in the hole;
      etching the third dielectric layer to form a spacer inside the hole; and
      forming the gate electrode in the hole.

4. The method of claim 1 wherein:
   forming the gate electrode further comprises:
      forming the gate electrode to be separated from the field plate by a distance of between approximately 20 and 400 nanometers.

5. The method of claim 1 wherein:
   self-aligning the gate electrode comprises:
      shortening a length of the field plate to between approximately 300 and 2000 nanometers.

6. The method of claim 1 wherein:
   forming the field plate comprises:
      forming the field plate to comprise titanium tungsten nitride.

7. A method of manufacturing a semiconductor component, the method comprising:
   providing a semiconductor substrate;
   forming a first dielectric layer above the semiconductor substrate;
   forming a field plate above the first dielectric layer;
   self-aligning a gate electrode to the field plate;
   forming a semiconductor layer above the semiconductor substrate before forming the first dielectric layer; and
   forming a gate recess in the semiconductor layer,
   wherein:
      forming the first dielectric layer comprises:
         forming the first dielectric layer above the semiconductor layer.

8. A method of manufacturing a semiconductor component, the method comprising:
   providing a semiconductor substrate;
   forming a first dielectric layer above the semiconductor substrate;
   forming a field plate above the first dielectric layer; and
   self-aligning a gate electrode to the field plate,
   wherein:
      self aligning the gate electrode to the field plate further comprises:
         forming a second dielectric layer above the field plate and the first dielectric layer;
         forming a hole through the second dielectric layer to expose a portion of the field plate;
         removing the portion of the field plate;
         removing a portion of the first dielectric layer;
         depositing a third dielectric layer over the second dielectric layer and in the hole;
         etching the third dielectric layer to form a spacer inside the hole; and
         forming the gate electrode in the hole; and
      forming the second dielectric layer comprises:
         forming the second dielectric layer to comprise:
            a first tetra-ethyl-ortho-silicate layer;
            an aluminum-nitride layer; and
            a second tetra-ethyl-ortho-silicate layer.

9. The method of claim 8 wherein:
forming the second dielectric layer further comprises:
   forming the aluminum-nitride layer between the first tetra-ethyl-ortho-silicate layer and the second tetra-ethyl-ortho-silicate layer.

10. The method of claim 8 wherein:
forming the gate electrode comprises:
   forming a T-gate electrode having a titanium tungsten nitride layer.

11. The method of claim 10 wherein:
forming the T-gate electrode further comprises:
   plating a gold layer above the titanium tungsten nitride layer.

12. A method of manufacturing a semiconductor component, the method comprising:
providing a semiconductor substrate;
forming a first dielectric layer above the semiconductor substrate;
forming a field plate above the first dielectric layer; and
self-aligning a gate electrode to the field plate,
wherein:
   forming the first dielectric layer comprises:
      forming the first dielectric layer to comprise:
         a silicon-nitride layer; and
         an aluminum-nitride layer.

13. A method of manufacturing a semiconductor component, the method comprising:
providing a semiconductor substrate;
forming a first dielectric layer above the semiconductor substrate;
forming a field plate comprising titanium tungsten nitride above the first dielectric layer;
simultaneously forming a first ohmic contact region and a second ohmic contact region above the semiconductor substrate;
forming a second dielectric layer above the field plate, the first dielectric layer, the first ohmic contact region, and the second ohmic contact region;
forming a hole in the second dielectric layer and between the first ohmic contact region and the second ohmic contact region to expose a portion of the field plate;
removing the portion of the field plate;
removing a portion of the first dielectric layer;
depositing a third dielectric layer over the second dielectric layer and in the hole;
etching the third dielectric layer to form a spacer inside the hole; and
forming a T-gate electrode in and over the hole;
wherein:
   the spacer isolates the field plate from the T-gate electrode.

14. The method of claim 13 further comprising:
providing a semiconductor layer above the semiconductor substrate and below the first dielectric layer; and
forming a gate recess in the semiconductor layer,
wherein:
   forming the T-gate electrode comprises:
      forming the T-gate electrode in the hole and in the gate recess.

15. The method of claim 13 wherein:
forming the T-gate electrode further comprises:
   forming the T-gate electrode to be separated from the field plate by a distance of between approximately 20 and 400 nanometers.

16. The method of claim 13 wherein:
forming the field plate comprises:
   forming the field plate to have a length of between approximately 300 and 2000 nanometers.

17. The method of claim 13 wherein:
forming the second dielectric layer, forming the hole, removing the portion of the field plate, removing the portion of the first dielectric layer, depositing the third dielectric layer, etching the third dielectric layer, and forming the T-gate electrode comprise self-aligning the T-gate electrode to the field plate.

* * * * *